(12) United States Patent
Gajadharsing et al.

(10) Patent No.: US 8,022,760 B2
(45) Date of Patent: Sep. 20, 2011

(54) 3-WAY DOHERTY AMPLIFIER WITH MINIMUM OUTPUT NETWORK

(75) Inventors: Radjindrepersad Gajadharsing, Nijmegen (NL); Weng Chuen Edmund Neo, Nijmegen (NL); Marco Johannes Pelk, Rotterdam (NL); Leonardus Cornelis Nicolaas De Vreede, Pgnacker (NL); Ji Zhao, Nijmegen (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 12/809,757

(22) PCT Filed: Dec. 18, 2008

(86) PCT No.: PCT/IB2008/055410

§ 371 (c)(1),
(2), (4) Date: Aug. 13, 2010

(87) PCT Pub. No.: WO2009/081341

PCT Pub. Date: Jul. 2, 2009

(65) Prior Publication Data

US 2010/0315162 A1    Dec. 16, 2010

(30) Foreign Application Priority Data

Dec. 21, 2007   (EP) .................................... 07123961

(51) Int. Cl.
*H03F 3/68* (2006.01)
(52) U.S. Cl. .................................... 330/124 R; 330/295
(58) Field of Classification Search .............. 330/124 R, 330/295, 84, 126
See application file for complete search history.

(56) References Cited

U.S. PATENT DOCUMENTS

| 5,025,225 | A | 6/1991 | Tajima et al. |
| 7,145,387 | B2 * | 12/2006 | Hellberg .................... 330/124 R |
| 7,498,878 | B2 * | 3/2009 | Lim ........................... 330/124 R |
| 7,586,374 | B2 * | 9/2009 | Bouny .......................... 330/295 |
| 2006/0097783 | A1 | 5/2006 | Okubo et al. |

FOREIGN PATENT DOCUMENTS

| EP | 1 848 106 A2 | 10/2007 |
| WO | 01/95481 A1 | 12/2001 |
| WO | 2006/003608 A1 | 1/2006 |
| WO | 2006/123289 A2 | 11/2006 |

OTHER PUBLICATIONS

Srirattana, N. et al. "Analysis and Design of a High-Efficiency Multistage Doherty Power Amplifier for Wireless Communications," IEEE Trans. on Microwave Theory & Techs., vol. 53, No. 3, pp. 852-860 (Mar. 2005).
Neo, W, et al. "A Mixed-Signal Approach Towards Linear and Efficient N-Way Doherty Amplifiers," IEEE Trans. on Microwave Theory & Techns., vol. 55, No. 5; pp. 866-879 (May 2007).
International Search Report and Written Opinion for Int'l. Patent Appln. No. PCT/IB2008/055410 (Apr. 14, 2009).

* cited by examiner

*Primary Examiner* — Henry K Choe

(57) ABSTRACT

A 3-way Doherty amplifier has an amplifier input and an amplifier output. The amplifier has a main stage, a first peak stage and a second peak stage. The amplifier has an input network connecting the amplifier input to the inputs of the stages, and an output network connecting the stages to the amplifier output. The output network implements a phase shift of 90° between the output of the main stage and the amplifier output; a phase shift of 180° between the output of the first peak stage and the amplifier output; and a phase shift of 90° between the third output and the amplifier output.

5 Claims, 7 Drawing Sheets

3-WAY DOHERTY AMPLIFIER WITH MINIMUM OUTPUT NETWORK

FIELD OF THE INVENTION

The invention relates to an electronic device comprising a 3-way Doherty amplifier with an amplifier input and an amplifier output, wherein the amplifier has a main stage, a first peak stage and a second peak device; the amplifier has an input network connecting the amplifier input to a first input of the main stage, to a second input of the first peak stage and to a third input of the second peak stage; and the amplifier has an output network connecting a first output of the main stage, a second output of the first peak stage and a third output of the second peak stage to the amplifier output.

BACKGROUND OF THE INVENTION

As known, a classical Doherty amplifier has two amplifying stages arranged in parallel and of the same power capability. The first one of the stages (main stage) operates in a class-AB amplifier mode and the second one (peak stage) operates in a class-C amplifier mode. These stages are separated at their inputs and at their outputs by 90° phase-shifting networks. The output phase-shifting network has a specific characteristic impedance $Z_0$ which must be equal to the optimal load impedance $RL_m$ of the main stage. The input signal is split so as to drive the two amplifiers, and a summing network, known as an "impedance inverter" or a "Doherty combiner", is operative to: a) combine the two output signals, b) to correct for phase differences between the two output signals, and c) to provide an inverted impedance at the output of the Doherty amplifier with respect to the impedance as seen from the output of the main stage.

The classical Doherty amplifier is a so-called 2-way amplifier with a main stage and a single peak stage. A multi-way (or N-way) Doherty amplifier has a main stage and a plurality of peak stages operating in parallel. An advantage of a multi-way Doherty system is that it extends the back-of level far beyond the symmetrical 2-way design without exhibiting significant drop in efficiency between the efficiency peaking points. As a result, an improvement of efficiency is possible at 12 dB power back-off, not at 6 dB back-off as for a symmetrical 2-way Doherty amplifier. The 12 dB power back-off is currently demanded by new communication systems such as 3G-LTE (third generation long-term evolution) and WiMAX (Worldwide Interoperability for Microwave Access). A classical 3-way Doherty requires quarter-wave-length lines between the outputs of the main stage and its first peak stage and also between the outputs of the first and additional peak stages. This makes the design of such a Doherty system very complicated. In addition, such design requires a large space in order to accommodate it, and mass-production samples can be predicted as showing very inconsistent behavior.

Typically, the main stage and the peak stages are implemented using a respective power transistor as each of the respective stages.

SUMMARY OF THE INVENTION

The efficiency of a 2-way Doherty amplifier (having a main stage and a single peak stage) can be increased by extending it into a 3-way Doherty amplifier by adding a second peak stage. This will mainly benefit input signals with large peak-to-average ratios. A problem with this conventional 3-way Doherty amplifier is that the load-line modulation of the main stage stops at a certain power level, thereby causing heavy saturation of the main stage and, consequently, a significant degradation of the linearity between the input and output of the Doherty amplifier. A typical way of avoiding this degradation is using complicated drive profiles at the input, thereby increasing the complexity of the input splitter. Another problem is that, if the main and peak stages have equal configuration, marginal improvement is obtained relative to the symmetrical 2-way Doherty amplifier. This forces the designer to select different transistor sizes resulting in complicated device selection procedures.

Reference is now made to the publication "A Mixed-Signal Approach Towards Linear and Efficient N-Way Doherty Amplifiers", W. C. Edmund Neo, Jawad Qureshi, Marco J. Pelk, John R. Gajadharsing and Leo C. N. de Vreede, IEEE Transactions on Microwave Theory and Techniques, Vol. 55, No. 5, pp 866-879, May 2007. In this publication, the authors model the output network of an N-way Doherty amplifier as an (N+1)-port network. The model enables to find, for a given set of (N−1) free-to-choose high-efficiency power back-off points, the proper parameters of the output network and the related functional behavior of the drive currents. This should provide a total output power of the Doherty amplifier that depends linearly on the input power (or proportional to the square of the input voltage), while at the same time the overall drain efficiency is maximized at the peak level and the N−1 back-off power levels.

The inventors now consider the 4-port network to model a general output network of a 3-way Doherty amplifier. The output network is preferably configured in such a way that, as a whole, a real transformation (as opposed to a complex transformation having an imaginary part) is implemented between the outputs of the main stage and peak stages, on the one hand, and the output of the Doherty amplifier, on the other hand. The load of the Doherty amplifier is considered a resistance, i.e., a real-valued load. If the transformation had an imaginary part, the power efficiency would decrease. This then could be compensated for by adding compensation elements, but this in turn would contribute to the complexity and cost of the design. The inventors also aimed specifically at minimizing the number of components of the output network.

The above modeling has led the inventors to come up with an N-way Doherty amplifier whose output network enables load-line modulation over the full dynamic range, using a simple passive splitter at the input network and, in practical embodiments, using a minimum of components to implement the output network. The inventors have also applied this generic concept to 3-way Doherty amplifiers in quarter-wave transmission line embodiments as well as in lumped-element embodiments.

More specifically, the inventors propose an electronic device as specified in claim 1. An electronic device in the invention comprises an N-way Doherty amplifier with an amplifier input and an amplifier output. The quantity N is an integer larger than two. The amplifier has a main stage and (N−1) peak stages in an ordered arrangement. The (N−1) peak stages include at least a first peak stage and a second peak stage. The amplifier has an input network connecting the amplifier input to a first input of the main stage, and to respective inputs of respective ones of the peak stages. The amplifier has an output network connecting, on the one hand, a first output of the main stage, and respective outputs of respective ones of the (N−1) peak stages to the amplifier output, on the other hand. The output network implements a first impedance, as experienced by the main stage, with a first phase shift of 90° between the first output and the amplifier output. The output network implements a respective further impedance as experienced by a respective one of the (N−1)

peak stages, with a respective further phase shift between the output of the respective peak stage and the amplifier output. Each specific one of the further phase shifts for a specific one of the peak stages is larger by 90° than another further phase shift of another one of the peak stages next in the ordered arrangement. The input network implements a second impedance with a second phase shift of (N−2) times 90° between the amplifier input and the first input of the main stage. The input network implements a respective additional impedance with a respective one of additional phase shifts between the amplifier input and the respective input of the respective peak stage. Each specific one of the additional phase shifts for a specific one of the peak stages is larger by 90° than the additional phase shift of a previous one of the peak stages in the ordered arrangement. The additional phase shift between the amplifier input and the first peak stage is 0°.

In an embodiment, each respective one of the first impedance, second impedance, further impedances and additional impedances is implemented with a respective quarter-wave transmission line.

An embodiment of the electronic device of the invention comprises a 3-way Doherty amplifier with an amplifier input and an amplifier output. The amplifier has a main stage, a first peak stage and a second peak stage. The amplifier has an input network connecting the amplifier input to a first input of the main stage, to a second input of the first peak stage and to a third input of the second peak stage. The amplifier has an output network connecting a first output of the main stage, a second output of the first peak stage and a third output of the second peak stage to the amplifier output. The output network implements a first impedance, as experienced by the main stage, with a first phase shift of 90° between the first output and the amplifier output; a second impedance, as experienced by the first peak stage, with a second phase shift of 180° between the second output and the amplifier output; and a third impedance, as experienced by the second peak stage, with a third phase shift of 90° between the third output and the amplifier output. The input network preferably has a fourth impedance between the amplifier input and the first input, and a fifth impedance between the amplifier input and the third input, each of the fourth and fifth impedances providing a phase shift of 90°.

A phase shift of an odd number times 90°, for example, 270°, instead of just 90°, would be operational but would also lead to power losses and to a decrease of bandwidth.

In a transmission line embodiment of the 3-way Doherty amplifier in the invention, the output network consists of a first quarter-wave transmission line connected between the first output and the amplifier output; a second quarter-wave transmission line connected between the second output and the third output; and a third quarter-wave transmission line connected between the third output and the amplifier output.

In a lumped-element embodiment of the invention, the output network consists of: a first capacitor between the first output and signal-ground; a second capacitor between the second output and signal-ground; a third capacitor between the third output and signal-ground; a fourth capacitor between the amplifier output and signal-ground; a first inductor between the first output and the amplifier output; a second inductor between the second output and the third output; and a third inductor between the third output and the amplifier output.

The values of the impedances thus used in both the transmission line embodiment and the lumped-element embodiment, depend primarily on the chosen power back-off points.

Thus, the invention provides a novel way of combining the outputs of main stage, first peak stage and second peak stage so as to enable load-line modulation over the full dynamic range and to avoid severe non-linear behavior. The novel way of combining accommodates the use of simple passive splitters. The novel way of combining provides for a high instantaneous efficiency at large back-offs with fewer than three device sizes. The novel way of combining enables a high instantaneous efficiency at 6 dB back-off and at 9.5 dB back-off with only a single device size.

Throughout this text, the phase shifts have been numerically indicated as 0°, 90° or 180°. These numerical values are to be understood as to cover a (small) range of degrees around 0°, 90° and 180°, respectively, meaning that the phase shift assumes numerical values that are considered to be 0°, 90° and 180°, respectively, for all practical purposes of the Doherty amplifier in operational use.

BRIEF DESCRIPTION OF THE DRAWINGS

The invention is explained in further detail, by way of example and with reference to the accompanying drawing, wherein.

DETAILED DESCRIPTION OF THE EMBODIMENTS

The efficiency of a 2-way Doherty amplifier can be increased by extending it with an additional peak stage so as to form a 3-way Doherty amplifier. One issue of the conventional 3-way Doherty amplifier is that the load-line modulation of the main stage stops at a certain power level, causing heavy saturation of the main stage and a severe degradation of the linearity. One way of avoiding this involves using complicated drive profiles at the input network of the 3-way Doherty amplifier, thereby increasing the complexity of the input splitter. Another issue is that if three equal transistor devices are used to implement the three stages, a marginal improvement is obtained with respect to the symmetrical 2-way Doherty amplifier. The designer is then forced to choose different transistor power sizes, resulting in complicated selection procedures for individual configurations of the 3-way Doherty amplifier. The invention now addresses both issues.

Figure 1:
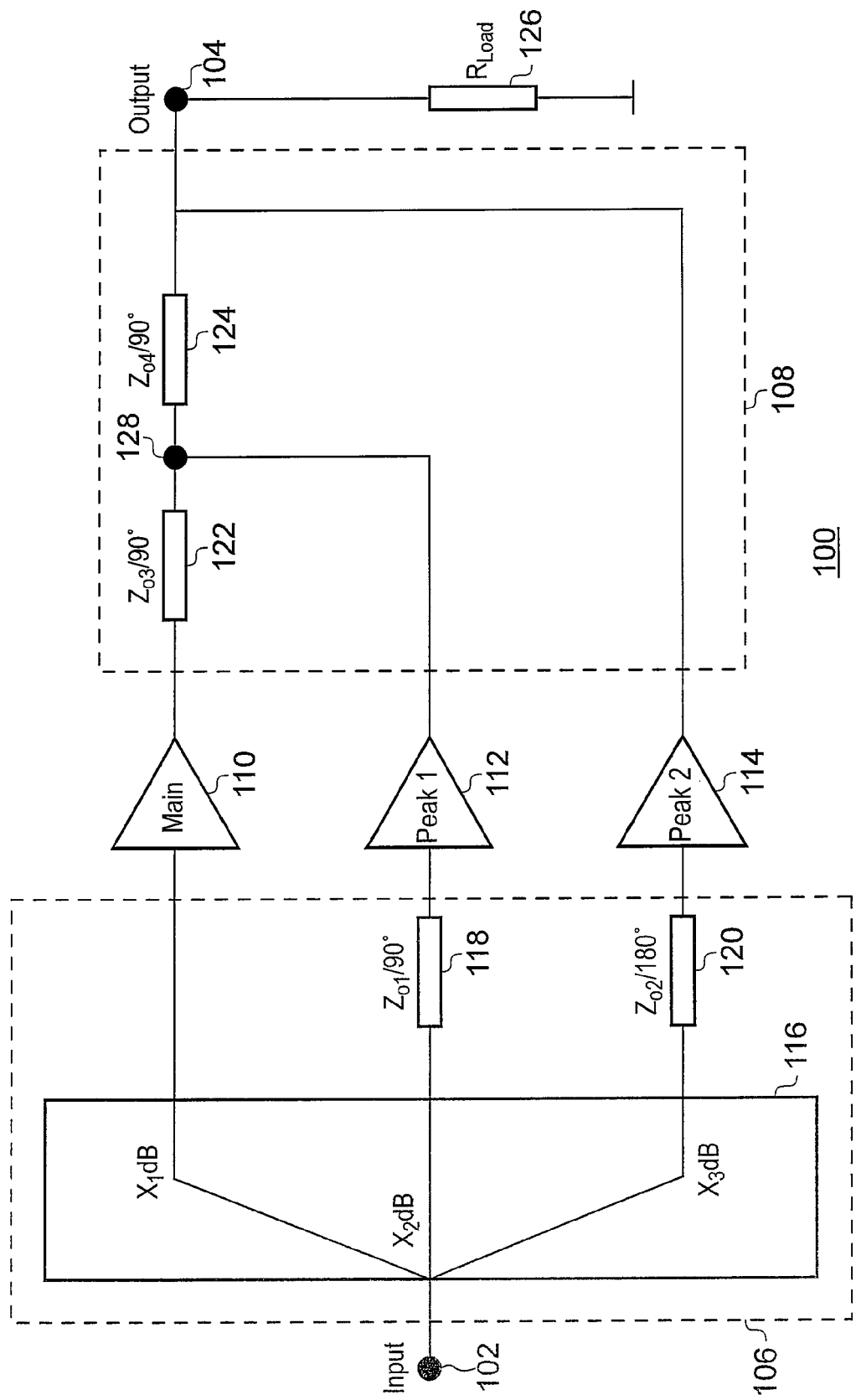
FIG. 1 is a diagram of a conventional 3-way Doherty amplifier.

FIG. 1 is a diagram of a conventional 3-way Doherty amplifier 100 having an amplifier input 102, an amplifier output 104, an input network 106, an output network 108, a main stage 110, a first peak stage 112, and a second peak stage 114. Input network comprises a splitter 116 to distribute the power of the input signal, received at input 102, between stages 110, 112 and 114. Input network further comprises an impedance 118 between input 102 and an input of first peak stage 112, and an impedance 120 between input 102 and an input of second peak stage 114. Output network 108 comprises a series arrangement of an impedance 122 and an impedance 124 between an output of main stage 110 and output 104. An output of first peak stage 112 is connected between impedances 122 and 124, and an output of second peak stage 114 is connected to output 104. Amplifier 100 is used to drive a load 126 that is represented by a resistance 126.

The way wherein the output signals from stages 110, 112 and 114 are combined in output network 108 gives rise to a disrupted load-line modulation of main stage 110, causing heavy saturation and strong degradation of the linearity if splitter 116 is simply implemented with passive components.

Figure 2:
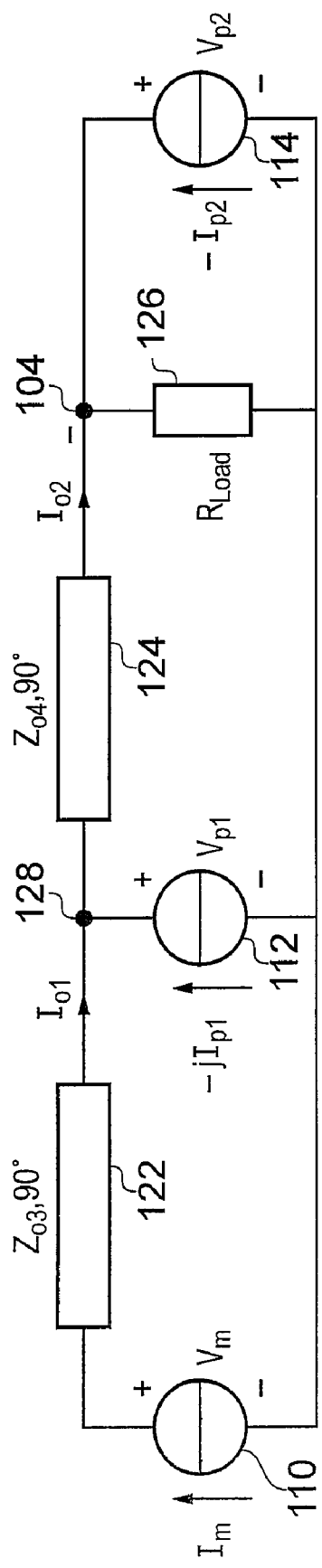
FIG. 2 is a circuit diagram explaining operation of the amplifier of FIG. 1.

FIG. 2 is a circuit diagram for explaining operation of 3-way Doherty amplifier 100. The operation of amplifier 100 can be divided into three main regions. At low power levels, where the input power is lower than the threshold levels of peak stages 112 and 114, main stage 110 is the only device supplying current to load 126. The impedance present at the output of main stage 110, due to the double impedance inverters 122 and 124, ensures that main amplifier 110 enters voltage saturation well below its maximum peak power capability and reaches its maximum efficiency point. This results in a first peak efficiency point in back-off. If the input power level exceeds the threshold level (transition point) of first peak stage 112, stage 112 starts to deliver current which adds in-phase with the current from main stage 110 at a node 128 between impedances 122 and 124 and is delivered to the equivalent load $Z_{o4}^2/R_{Load}$, increasing the RF output voltage at node 128. Therefore, the apparent impedance seen by the output of impedance inverter 122 is higher than the actual equivalent load impedance at node 128. Owing to this active load-pulling effect, the impedance as seen by the output of main stage 110, decreases and its power contribution increases. The output power from both stages 110 and 112 increases with increasing signal level until first peak stage 112 also enters voltage saturation. This results in a second peak efficiency point in back-off. The consequence of voltage saturation at node 128 is that current saturation occurs at main stage 110, resulting in disrupted load-line modulation. For the remainder of the input power range main stage 110 experiences overdrive resulting in heavy saturation and severe linearity degradation. One way to avoid this is utilizing active drive profiling, which results in a considerable increase of the circuit's complexity. If the input power level exceeds the threshold level of second peak stage 114, stage 114 starts to deliver current which adds in-phase with the currents from first peak stage 114 and from main stage 110 at output 104. This in turn results in further increasing the RF output voltage at load 126.

The output power from each of peak stages 112 and 114 increases with increasing signal level until the peak power capability is reached. Within the region between the first transition point and peak power, the efficiency of main stage 110 remains at its maximum value. The efficiency of first peak stage 112 remains at its maximum value between the second transition point and peak power. The efficiency of second peak stage 114 varies between zero and its maximum value at its maximum peak power level. Three-way Doherty amplifier 100 thus exhibits three efficiency peaking points.

Figure 3:
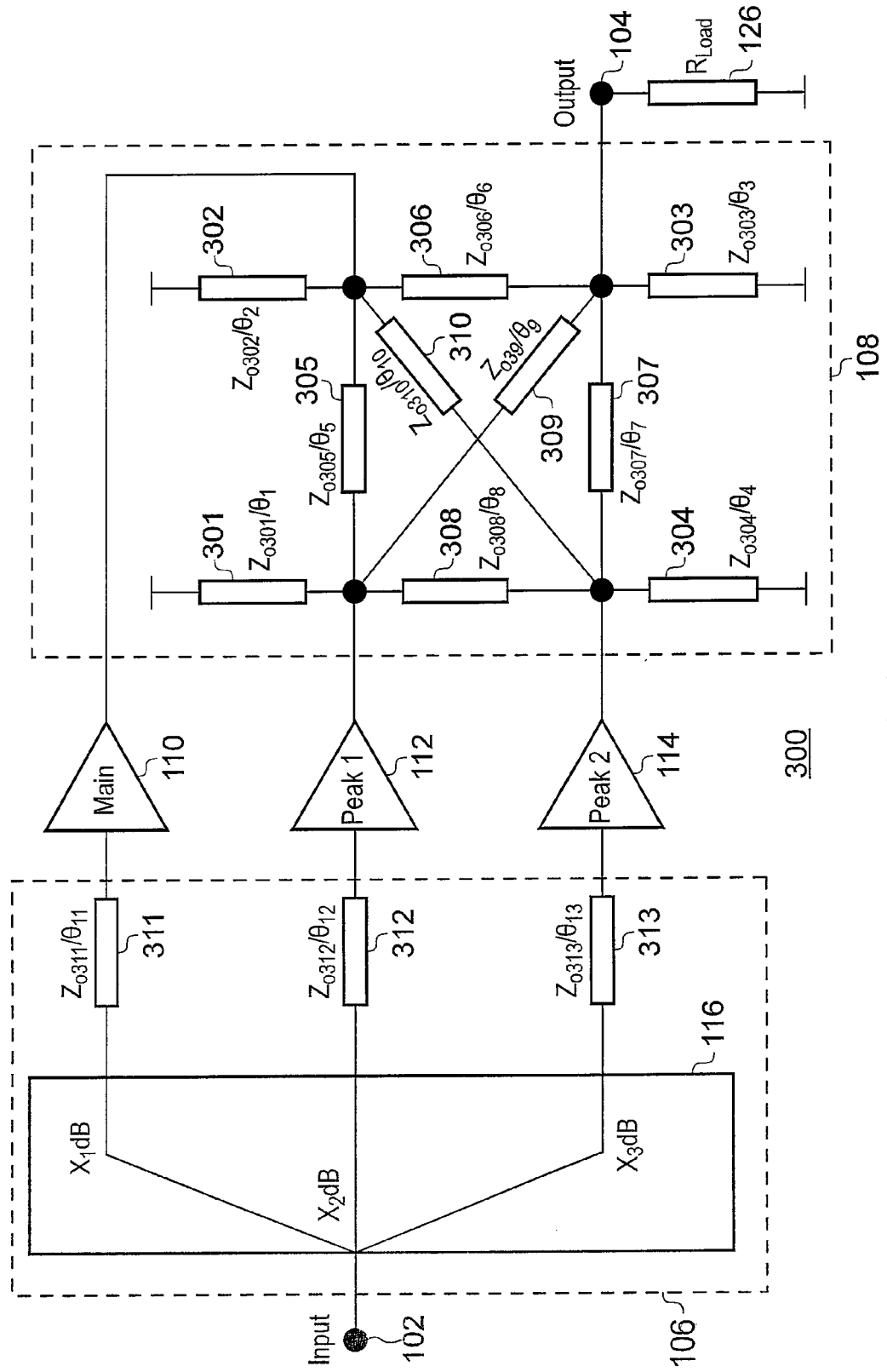
FIG. 3 is a diagram of a Doherty amplifier whose output network is modeled as a general four-port network.

FIG. 3 is a diagram of a general 3-way Doherty amplifier 300, whose output network 108 is modeled as a four-port network. Network 108 comprises impedances 301, 302, 303, 304, 305, 306, 307, 308, 309 and 310. Impedances 301-310 represent all possible interconnections between any pair of: the outputs of stages 110, 112 and 114, output 104 and signal-ground. Input network 106 comprises impedances 311, 312 and 313 connecting splitter 116 to the inputs of stages 110, 112 and 114, respectively.

The (complex) values of the impedances and therefore their phase shifting properties depend on the chosen power back-off points that in turn determine the distribution of the power ($X_1$, $X_2$ and X3) between main stage 110 and first and second peak stages 112 and 114.

Figure 4:
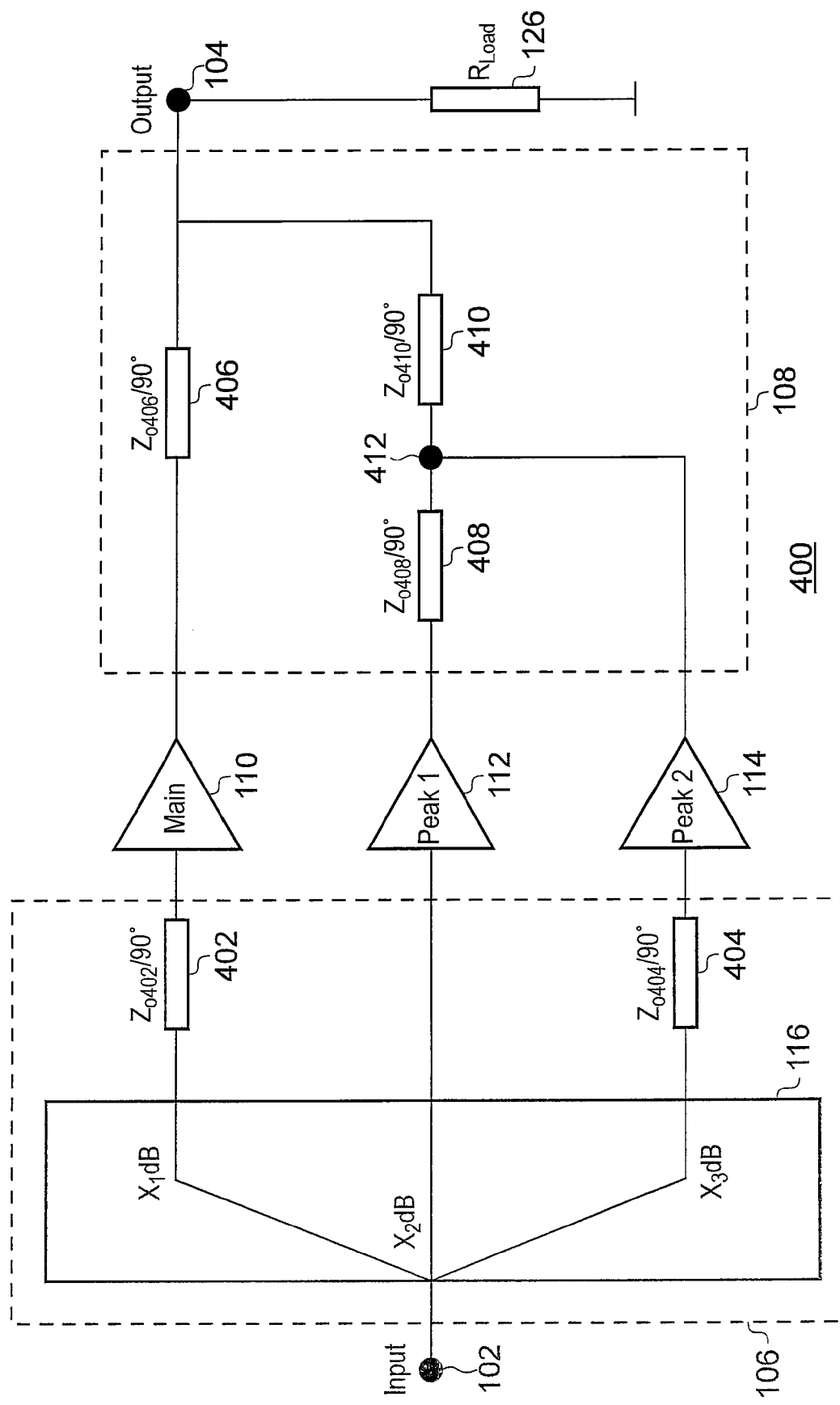
FIG. 4 is a diagram of a Doherty amplifier of the invention implemented with quarter-wave transmission lines.

FIG. 4 is a diagram of a first embodiment 400 of a 3-way Doherty amplifier in the invention that is believed to use the minimum number of transmission lines, here three quarter-wave transmission lines 406, 408 and 410. Input network 106 uses a quarter-wave transmission line 402 between input 102 and the input of main stage 110, and a quarter-wave transmission line 404 between input 102 and the input of second peak stage 112. Main stage 110 and peak stages 112 and 114 are considered as ideal, voltage-controlled, current sources.

As before, their impedance values are dependent on the power back-off points. The currents, caused by stages 110-114 in output network 108, can be individually determined and then linearly combined owing to network 108 being a linear network.

Figure 5:
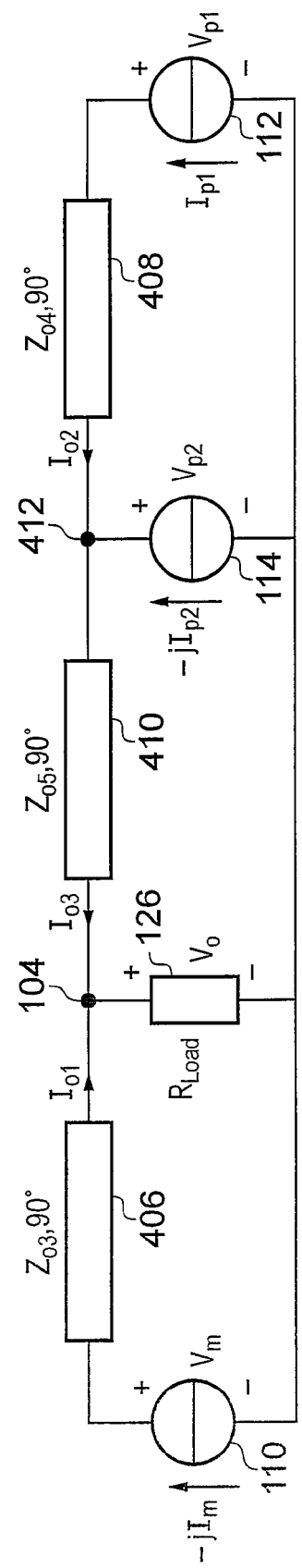
FIG. 5 is a circuit diagram explaining operation of the amplifier of FIG. 4.

FIG. 5 is a circuit diagram for explaining the operation of 3-way Doherty amplifier 400.

The operation of amplifier 400 can be divided into three main regions. At low power levels, where the input power is lower than the threshold levels of peak stages 112 and 114, main stage 110 is the only device supplying current to load 126. The impedance present at its output, due to impedance inverter 406, ensures that main stage 110 enters voltage saturation well below its maximum peak power capability and reaches its maximum efficiency point. This results in a first peak efficiency point in back-off. If the input power level exceeds the threshold level (transition point) of first peak stage 112, stage 112 starts to deliver current to load 126, which adds in-phase with the current from main stage 110 at node 104, increasing the RF output voltage at load 126. Therefore, the apparent impedance seen by the output of impedance inverter 406 is higher than the actual load impedance. Through this active load-pulling effect, the impedance seen by the output of main stage 110 decreases and its power contribution increases. The output power from stages 110 and 112 increases with increasing signal level until first peak stage 112 enters voltage saturation below its maximum peak power capability. This results in a second peak efficiency point in back-off. If the input power level exceeds the threshold level of second peak stage 114, stage 114 starts to deliver current which first adds in-phase with the current from first peak stage at a nod 412 and subsequently with the current from main stage 110 at node 104, resulting in further increasing the RF output voltage at load 126. As a result, the load of main stage 110 is modulated over the full power range. The output power from stages 110, 112 and 114 increases with increasing signal level until the peak power capability is reached. Within the region between the first transition point and peak power, the efficiency of main stage 110 remains at its maximum value. The efficiency of first peak stage 112 remains at its maximum value between the second transition point and peak power. The efficiency of second peak stage 114 varies between zero and its maximum value at its maximum peak power level.

Thus, 3-way Doherty amplifier 400 exhibits three efficiency peaking points.

Figure 6:
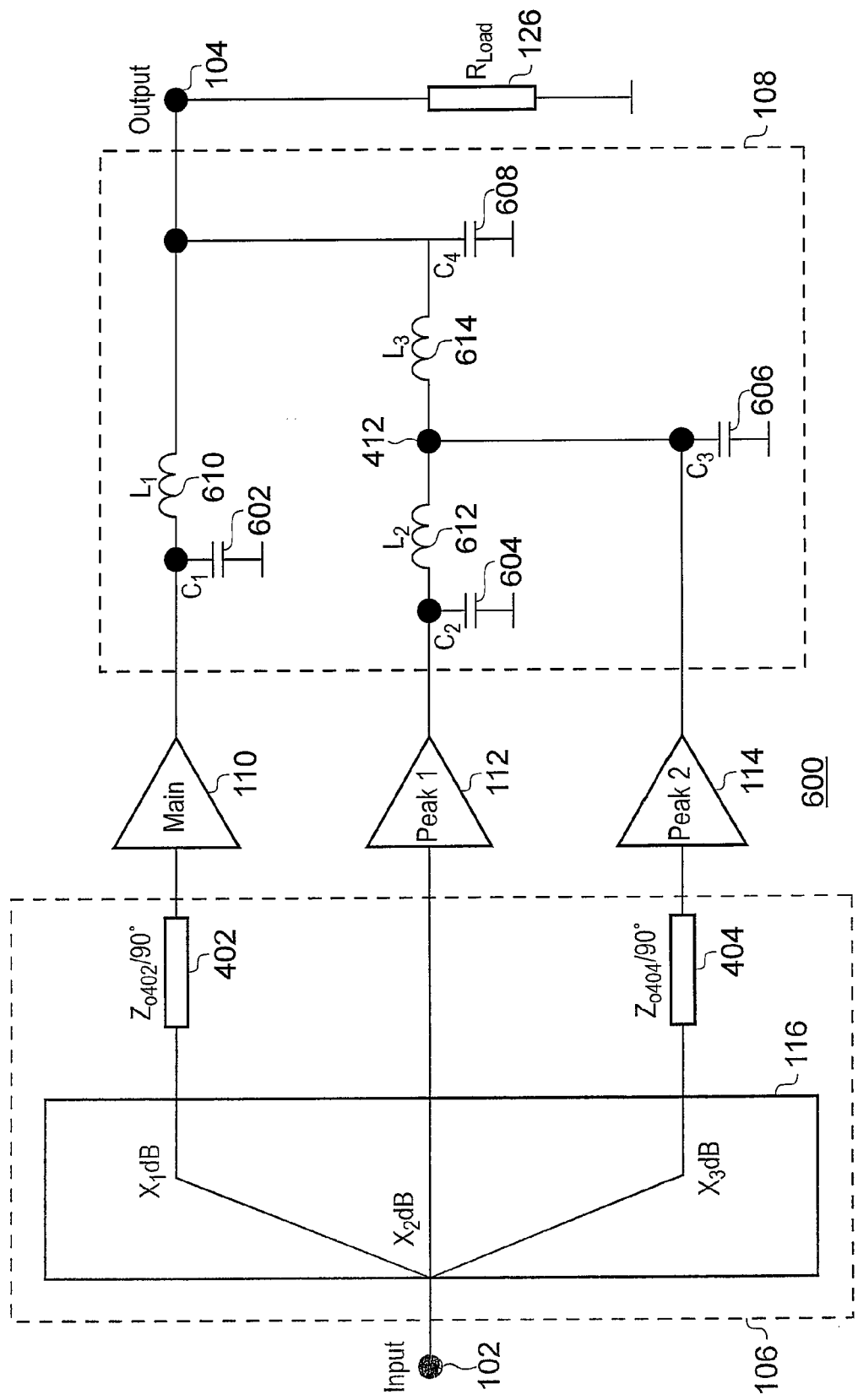
FIG. 6 is a diagram of a Doherty amplifier in the invention implemented with lumped elements.

FIG. 6 is a diagram of a second embodiment 600 of a 3-way Doherty amplifier in the invention that is believed to use the minimum number of lumped elements in output network 108. In embodiment 600 output network 108 consists of a first capacitor 602 between the output of main stage 110 and signal-ground; a second capacitor 604 between the output of first peak stage 112 and signal-ground; a third capacitor 606 between the output of second peak stage 114 and signal-ground; a fourth capacitor 608 between output 104 and signal-ground; a first inductor 610 between the output of main stage 110 and output 104; a second inductor 612 between the output of first peak stage 112 and the output of second peak stage 114; and a third inductor 614 between the output of second peak stage 114 and output 104. Input network 106 uses an impedance 402 between input 102 and the input of main stage 110, and an impedance 404 between input 102 and the input of second peak stage 112, both serving to provide a 90° phase shift.

Functionally, operation of embodiment 600 is equivalent to the operation described with reference to FIG. 5.

Figure 7:
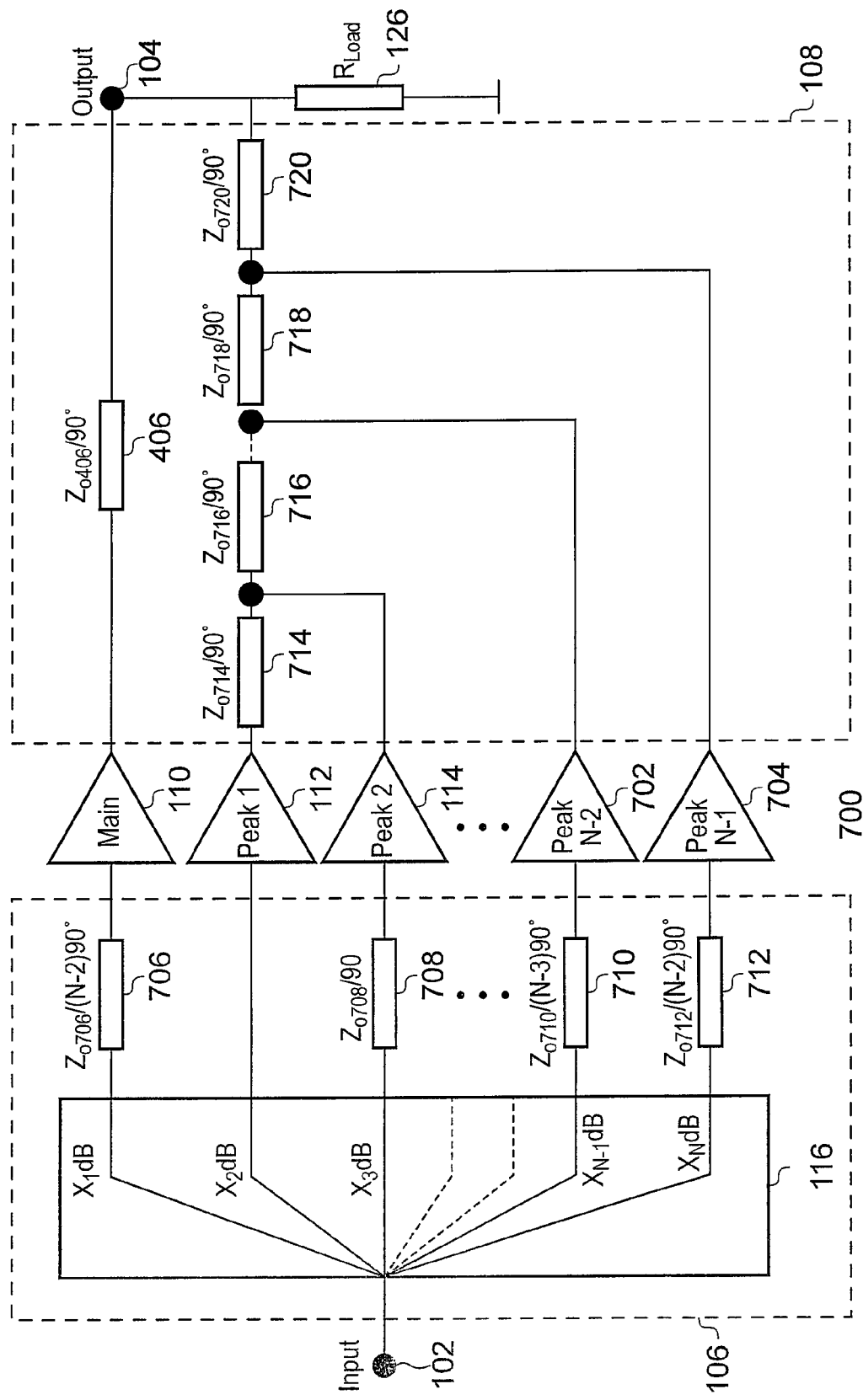
FIG. 7 is a diagram of an N-way Doherty amplifier in the invention. Throughout the Figures, similar or corresponding features are indicated by same reference numerals.

FIG. 7 is a diagram of an N-way Doherty amplifier 700 in the invention. The concept as discussed above for the 3-way Doherty amplifiers 400 and 600 can be extended to multi-way Doherty amplifiers in general using a systemic approach. Amplifier 700 comprises input network 106, output network 108 main stage 110, first peak stage 112, second peak stage 114, and (N−3) further peak stages of which only peak stage 702 and peak stage 704 have been drawn in order to to not obscure the drawing. Splitter 116 distributes the power among stages 110, 112, 114, . . . , 702 and 704 as indicated by labels "$X_1$ dB", "$X_2$ dB", "$X_3$ dB", . . . , "$X_{N-1}$ dB" and "$X_N$ dB". Input network 106 comprises an impedance 706, an impedance 708, . . . , an impedance 710 and an impedance 712. Impedance 706 is connected between amplifier input 102 and the input of main stage 110. Impedance 706 shifts the phase of the signal at input 102 by (N−2) times 90°. Impedance 708 is connected between amplifier input 102 and the input of second peak stage 114. Impedance 708 shifts the phase of the signal at input 102 by 90°. Impedance 710 is connected between amplifier input 102 and the input of peak stage 702. Impedance 710 shifts the phase of the signal at input 102 by (N−3) times 90°. Impedance 712 is connected between amplifier input 102 and the input of peak stage 704. Impedance 712 shifts the phase of the signal at input 102 by (N−2) times 90°. Output network 108 has impedance 406 connected between main stage 110 and output 104 and implements a phase shift of 90° as discussed above with reference to amplifiers 400 of FIG. 4 and amplifier 600 of FIG. 6. Output network 108 further comprises a series arrangement of (N−1) impedances 714, 716, . . . , 718 and 720 between the output of first peak stage 112 and output 104. The output of each respective one of amplifiers 114, . . . , 702 and 704 is connected between a respective pair of adjacent ones of impedances 714-720. As is clear from the diagram, the configuration of N-way Doherty amplifier 700 shows an innate regularity and symmetry that facilitate optimizing the layout of the circuit.

The invention claimed is:

1. An electronic device comprising:
an N-way Doherty amplifier with an amplifier input and an amplifier output, wherein:
N is an integer larger than two;
the amplifier has a main stage, and (N−1) peak stages in an ordered arrangement;
the (N−1) peak stages include at least a first peak stage and a second peak stage;
the amplifier has an input network connecting the amplifier input to a first input of the main stage, and to respective inputs of respective ones of the peak stages;
the amplifier has an output network connecting, on one hand, a first output of the main stage, and respective outputs of respective ones of the (N−1) peak stages to the amplifier output, on another hand;
the output network implements a first impedance, as experienced by the main stage, with a first phase shift of 90° between the first output and the amplifier output;
the output network implements a respective further impedance as experienced by a respective one of the (N−1) peak stages, with a respective further phase shift between the output of the respective peak stage and the amplifier output;
each specific one of the further phase shifts for a specific one of the peak stages is larger by 90° than another further phase shift of another one of the peak stages next in the ordered arrangement;
the input network implements a second impedance with a second phase shift of (N−2) times 90° between the amplifier input and the first input of the main stage;
the input network implements a respective additional impedance with a respective one of additional phase shifts between the amplifier input and the respective input of the respective peak stage;
each specific one of the additional phase shifts for a specific one of the peak stages is larger by 90° than the additional phase shift of a previous one of the peak stages in the ordered arrangement; and
the additional phase shift between the amplifier input and the first peak stage is 0°.

2. The device of claim 1, wherein each respective one of the first impedance, second impedance, further impedances and additional impedances is implemented with a respective quarter-wave transmission line.

3. The device of claim 2, wherein N equals 3.

4. The device of claim 1, wherein N equals 3.

5. The device of claim 4, wherein the output network comprises:
a first capacitor between the first output and signal-ground;
a second capacitor between the second output and signal-ground;
a third capacitor between the third output and signal-ground;
a fourth capacitor between the amplifier output and signal-ground;
a first inductor between the first output and the amplifier output;
a second inductor between the second output and the third output; and
a third inductor between the third output and the amplifier output.

* * * * *